(12) United States Patent
Lloyd (10) Patent No.: US 7,570,532 B1
(45) Date of Patent: Aug. 4, 2009

(54) OVERWRITING MEMORY CELLS USING LOW INSTANTANEOUS CURRENT

(75) Inventor: Russell Lloyd, Middleton, ID (US)

(73) Assignee: Zilog, Inc., San Jose, CA (US)

( * ) Notice: Subject to any disclaimer, the term of this patent is extended or adjusted under 35 U.S.C. 154(b) by 259 days.

(21) Appl. No.: 11/881,269

(22) Filed: Jul. 26, 2007

(51) Int. Cl.
*G11C 7/02* (2006.01)

(52) U.S. Cl. .......................... 365/210.14; 365/189.17; 365/191; 365/194; 365/210.12

(58) Field of Classification Search ............ 365/210.14, 365/189.17, 191, 194, 210.12
See application file for complete search history.

(56) References Cited

U.S. PATENT DOCUMENTS

| | | | |
|---|---|---|---|
| 4,928,266 A | 5/1990 | Abbott et al. | 365/189.01 |
| 4,949,308 A | 8/1990 | Araki et al. | 365/218 |
| 5,790,670 A | 8/1998 | Bramlett | 380/52 |
| 6,014,745 A | 1/2000 | Ashe | 713/193 |
| 6,480,096 B1 | 11/2002 | Gutman et al. | 340/5.31 |
| 6,581,162 B1 | 6/2003 | Angelo et al. | 713/193 |
| 6,862,237 B2 * | 3/2005 | Kato | 365/222 |
| 6,963,499 B2 | 11/2005 | Rimondi et al. | 365/154 |
| 6,965,520 B1 * | 11/2005 | Seshadri et al. | 365/145 |
| 7,525,855 B2 * | 4/2009 | Kagan | 365/189.17 |

* cited by examiner

*Primary Examiner*—Pho M. Luu
(74) *Attorney, Agent, or Firm*—Imperium Patent Works; Glen B. Choi; Darien K. Wallace (57) ABSTRACT

A memory device includes memory cells that are overwritten in response to receipt of a clear request signal and an overwrite value. The clear request signal enables all word lines of the memory device to be overwritten. The clear request signal in combination with the overwrite value cause the overwrite value to be written to a first column of memory cells. At least two delay elements transfer the overwrite value to another column of memory cells after a delay. By use of at least two delay elements to delay and transfer the overwrite value to be written to another column of memory cells, a relatively low magnitude of current can be used to cause memory cells to be overwritten. In addition, the value and sequence of values that overwrite memory cells can be controlled.

24 Claims, 5 Drawing Sheets

POINT OF SALE TERMINAL
FIG. 1

OVERWRITING MEMORY CELLS USING LOW INSTANTANEOUS CURRENT

TECHNICAL FIELD

The present invention relates to techniques for erasing or overwriting memory cells.

BACKGROUND

Point of sale (POS) terminals allow customers to make payments using a variety of payment instruments such as credit cards, debit cards, smart cards, and ATM cards. To ensure that the payment information transmitted from the POS terminals to a payment center is not accessed by unauthorized recipients, this information is typically encrypted and secured (e.g., using digital authentication) during transmission. However, confidential payment information entered by the user into the POS terminal could still be intercepted by tampering with the integrated circuits of the POS terminal. Thieves can use such information to fraudulently receive payment. Erasing a memory of the POS terminal that stores confidential information is a common way to prevent unauthorized access to confidential information.

In one known technique to overwrite a memory, a state machine is used to sequence through all cell locations in the memory and the state machine causes a value to be written to each cell of the memory (RAM). Overwriting of each cell is timed according to a clock signal. One drawback with this technique is that the memory clear operation takes too many clock cycles to complete.

In another known technique for erasing a memory array, all word lines are activated for a random access memory (RAM) and a logic value of zero is asserted to all bit lines to overwrite the contents of all RAM cells to the asserted logic value. In this technique, delay elements are placed between arrays of memory cells so that each array of memory cells is overwritten to a logic value of zero after a delay. For example, U.S. Pat. No. 4,949,308 describes such a technique. An array of memory cells is cleared more effectively if all of the bits are first written to a logic one and then written to a logic zero. One disadvantage with the technique described in U.S. Pat. No. 4,949,308 is that the memory cells are overwritten with a zero value and there is no flexibility to choose a value or sequence of values used to overwrite memory cells.

SUMMARY

Overwriting cells in a memory array takes place in response to receipt of an asynchronous clear signal and a specified value. Overwriting cells occurs asynchronously and is not timed according to a clock signal. Delay elements are used in a memory array to control the number of memory cells overwritten at any time. The amount of delay introduced by delay elements controls the rate at which cells are overwritten. A memory cell is overwritten to the specified value when a word line associated with the memory cell is active. In one aspect, the word lines of the memory array are turned on at the beginning of the clear signal to allow memory cells of all word lines to be overwritten with the value presented at an input terminal. A first column of memory cells has a first input terminal and a second column of memory cells has a second input terminal. The specified value is presented to the first input terminal to overwrite memory cells in a first column of memory cells. At least two delay elements transfer the specified value from the first input terminal to the second input terminal to overwrite memory cells in the second column of memory cells. In one aspect, the input terminals are bit line pairs and the delay elements transfer the specified value between bit lines of the memory array. Providing delay elements between bit lines allows for a single column of cells to be overwritten at a time and thereby limits the amount of instantaneous current consumed. When multiple columns of cells are overwritten at the same time, more instantaneous current is consumed. The memory cells can be written to a logic one or a logic zero and the sequence of values written to the memory cells can be controlled.

In another aspect, each word line of the memory array after the first word line is turned-on after a delay. In this aspect, each cell of a memory array can be overwritten one cell at a time. Overwriting one memory cell at a time reduces consumption of instantaneous current when each cell is overwritten compared to simultaneously overwriting multiple cells. In addition, overwriting memory cells occurs asynchronously and is not timed according to a clock signal.

It is desirable to reduce the amount instantaneous current used because too high an instantaneous current can damage the memory array. In addition, too high an instantaneous current causes the instantaneous voltage provided by the battery to droop and other components that use the voltage from the battery as a supply voltage can malfunction.

Other embodiments and advantages are described in the detailed description below. This summary does not purport to define the inventions. The inventions are defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
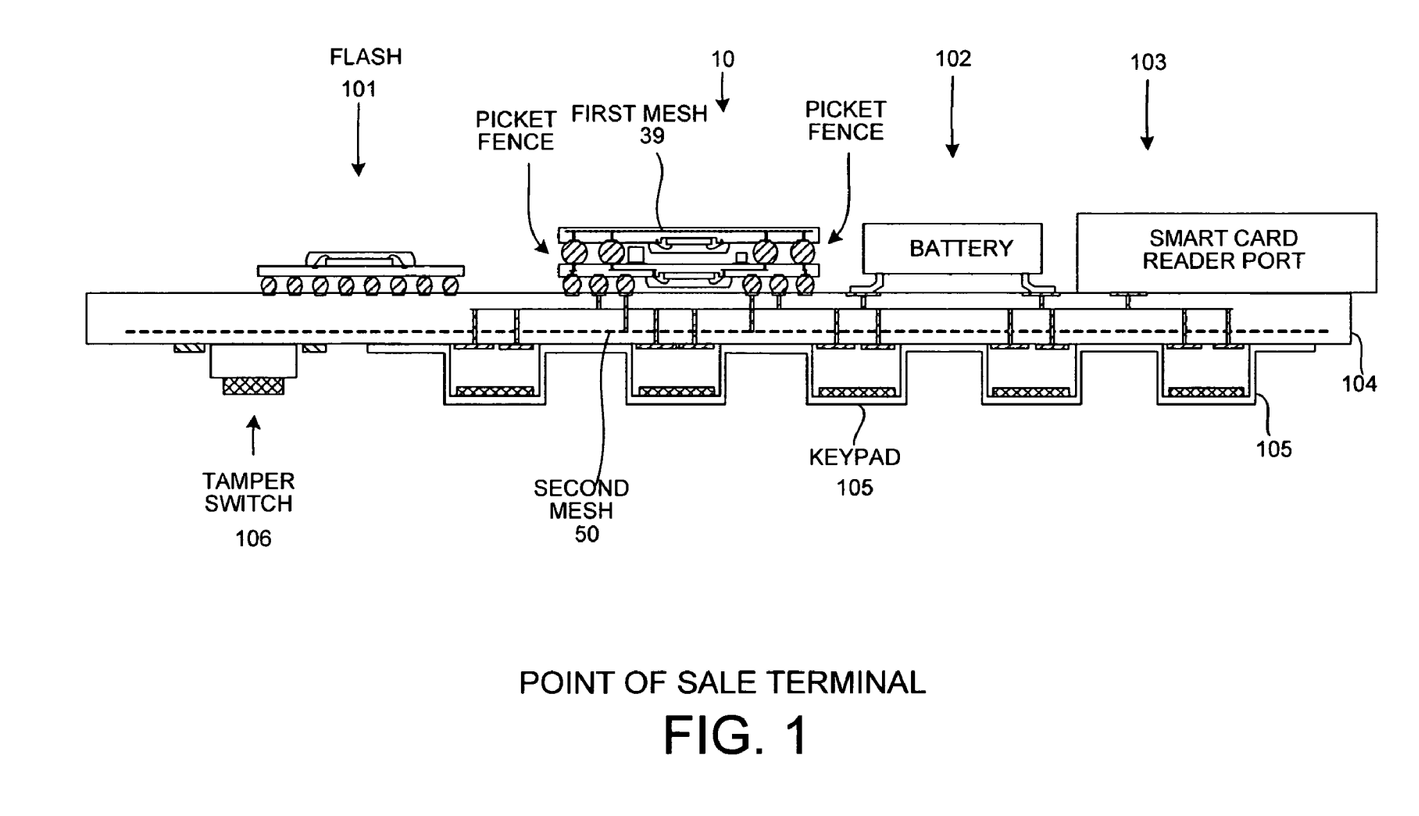
FIG. 1 is a simplified circuit diagram that shows a manner in which first and second meshes can be connected to an integrated circuit die, in accordance with an embodiment.

FIG. 1 is a cross-sectional diagram of a portion of a point of sale (POS) terminal 100 that includes POP secure module 10. For additional details of POP secure module 10, see: U.S. patent application Ser. No. 11/800,175, entitled "PACKAGE-ON-PACKAGE SECURE MODULE HAVING BGA MESH CAP", filed May 3, 2007, inventors Eaton, Staab, and Zeta, which is incorporated herein by reference in its entirety. A plastic enclosure of POS terminal 100 is not illustrated. POP secure module 10, a FLASH memory device 101, a battery 102, and a smart card reader port 103 are surface mounted to a first side of a printed circuit board 104. A flexible keypad 105 and a tamper detect switch 106 are disposed on a second side of the printed circuit board 104 opposite module 10. Each of the keys of keypad 105 has a conductive portion. When the key is pressed, the conductive portion of the key makes contact with and couples together an associated pair of interdigitated contact pads on printed circuit board 104. Integrated circuit die 14 includes key scanning circuitry for detecting which key is pressed.

As illustrated in FIG. 1, the second anti-tamper security mesh 50 is disposed in a metal trace layer within printed circuit board 104. The interdigitated contact pads for the keypad are parts of the bottom metal layer. Second anti-tamper security mesh 50 is located in the next bottom most metal layer so that it is close to keypad 105. Providing mesh 50 close to keypad 105 helps prevent a hacker from gaining access to the backside of the keypad and monitoring key presses.

Figure 2:
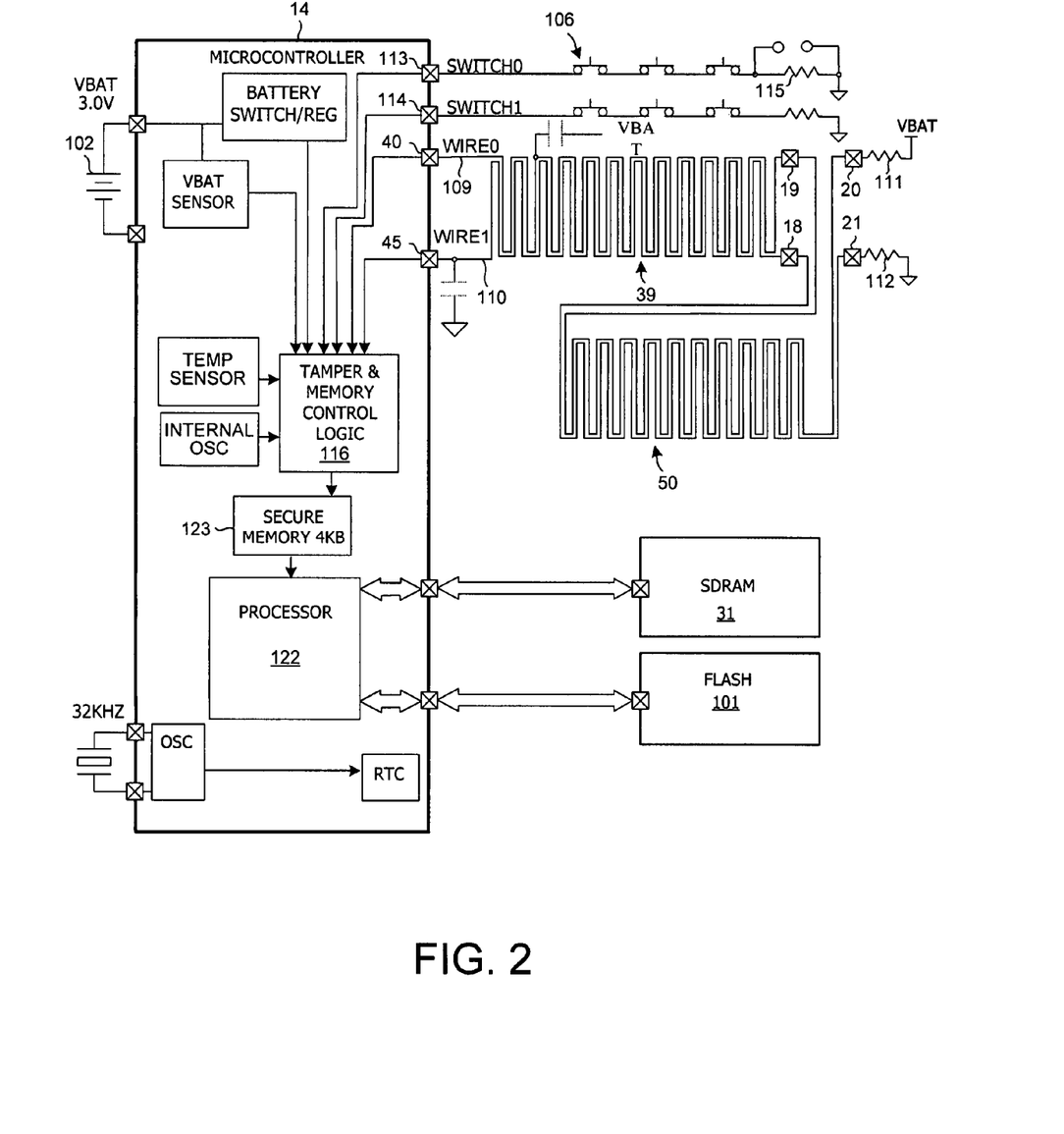
FIG. 2 is a simplified circuit diagram that shows another way that first and second meshes can be connected to an integrated circuit die, in accordance with an embodiment.

FIG. 2 is a simplified circuit diagram that shows another way that first and second meshes 39 and 50 can be connected to integrated circuit die 14, in accordance with an embodiment. In this example, first mesh 39 extends laterally through the substrate member of the second BGA package portion 12 and second mesh 50 extends laterally through printed circuit board 104. Meshes 39 and 50 are, however, driven and monitored from only two terminals of integrated circuit 14. First conductor 109 (WIRE0) extends from terminal 40, through a bond wire, then up through the substrate member of the second BGA package portion, laterally through the substrate member, then back down through a bond ball of the second BGA package portion and to bond ball 19 of the first BGA package portion. From bond ball 19, the conductor continues down into the printed circuit board 104 upon which the secure module 10 is disposed. The conductor extends laterally through the mesh layer of the printed circuit board as a part of second mesh 50, and then extends back up to another bond ball 20 of the first BGA package portion. Band ball 20 is connected through the first BGA package portion to discrete resistor 111. The second conductor 110 (WIRE1) is connected in similar fashion. The second conductor 110 extends from integrated circuit terminal 45, through another bond wire, then up through the substrate member of the second BGA package portion, laterally through the substrate member, then back down through a bond ball of the second BGA package portion and to bond ball 18 of the first BGA package portion. From bond ball 18, the conductor continues down into the printed circuit board 104 upon which the secure module 10 is disposed. The conductor extends laterally through the mesh layer of the printed circuit board as a part of second mesh 50, and then extends back up to another bond ball 21 of the first BGA package portion. Band ball 21 is connected through the first BGA package portion to discrete resistor 112. The first mesh 39 and the second mesh 50 are therefore not driven and monitored separately from one another, but actually form a single larger anti-tamper mesh structure that extends both over and underneath the integrated circuits within the secure module 10. If the secure module 10 is to be used in a configuration without second mesh 50, then bond ball 19 can be coupled directly to bond ball 20 by a short trace on printed circuit board 104 or alternatively by a connection on secure module 10 itself. In the same way, bond ball 18 would be coupled directly to bond ball 21.

In response to unauthorized access to integrated circuit die 14 within POS terminal 100, sensitive information (such as sensitive financial, identification information, and encryption keys) stored within SRAM 31 are overwritten. Unauthorized access to components within POS terminal 100 can be detected in a variety of ways and causes alarms to be triggered so that sensitive information is overwritten. Tamper and memory control logic 116 detects unauthorized access and issues a clear signal in a logic one state to cause sensitive information in SRAM 31 to be overwritten.

Tamper switches are positioned at various places in the POS terminal such that opening the POS terminal enclosure will cause one of more of these switches to open. For example, the top and bottom portions of the plastic enclosure of the POS terminal together may hold one of these switches in the closed position. If the enclosure is opened, then the top and bottom portions will separate and will no longer hold switch 106 in the closed position. When a switch opens, the voltage on terminal 113 will no longer be pulled to ground potential by resistor 115, but rather the voltage on terminal 113 will be pulled high by a resistor internal to integrated circuit die 14. This high voltage event is detected by tamper control logic 116.

Tampering with mesh 39 or 50 is detected as an event by tamper control logic 116 using a wire sensor. The wire sensor detects whether the mesh has been tampered with by determining whether an impedance of the mesh has changed. For example, U.S. patent application Ser. No. 11/800,175, entitled "PACKAGE-ON-PACKAGE SECURE MODULE HAVING BGA MESH CAP", filed May 3, 2007, inventors Eaton, Staab, and Zeta, describes suitable techniques for using a mesh to detect unauthorized access to integrated circuit 14. Tamper control logic 116 determines whether a temperature of integrated circuit 14 is too high or too low using a temperature sensor. If the temperature is too high or too low, an event is recorded. In addition, tamper control logic 116 records an event of any of: bias voltage level is too high or too low; the frequency of clock signal used by integrated circuit 14 is too high or too low; or powering up or down the integrated circuit 14. In response to recording of one or more event, an alarm is triggered, and a memory that stores sensitive information can be overwritten or erased. In one aspect, multiple events of a particular sensor occur prior to triggering an alarm to overwrite memory. For example, multiple events arising out of the temperature being too high or too low cause triggering of an alarm.

Figure 3:
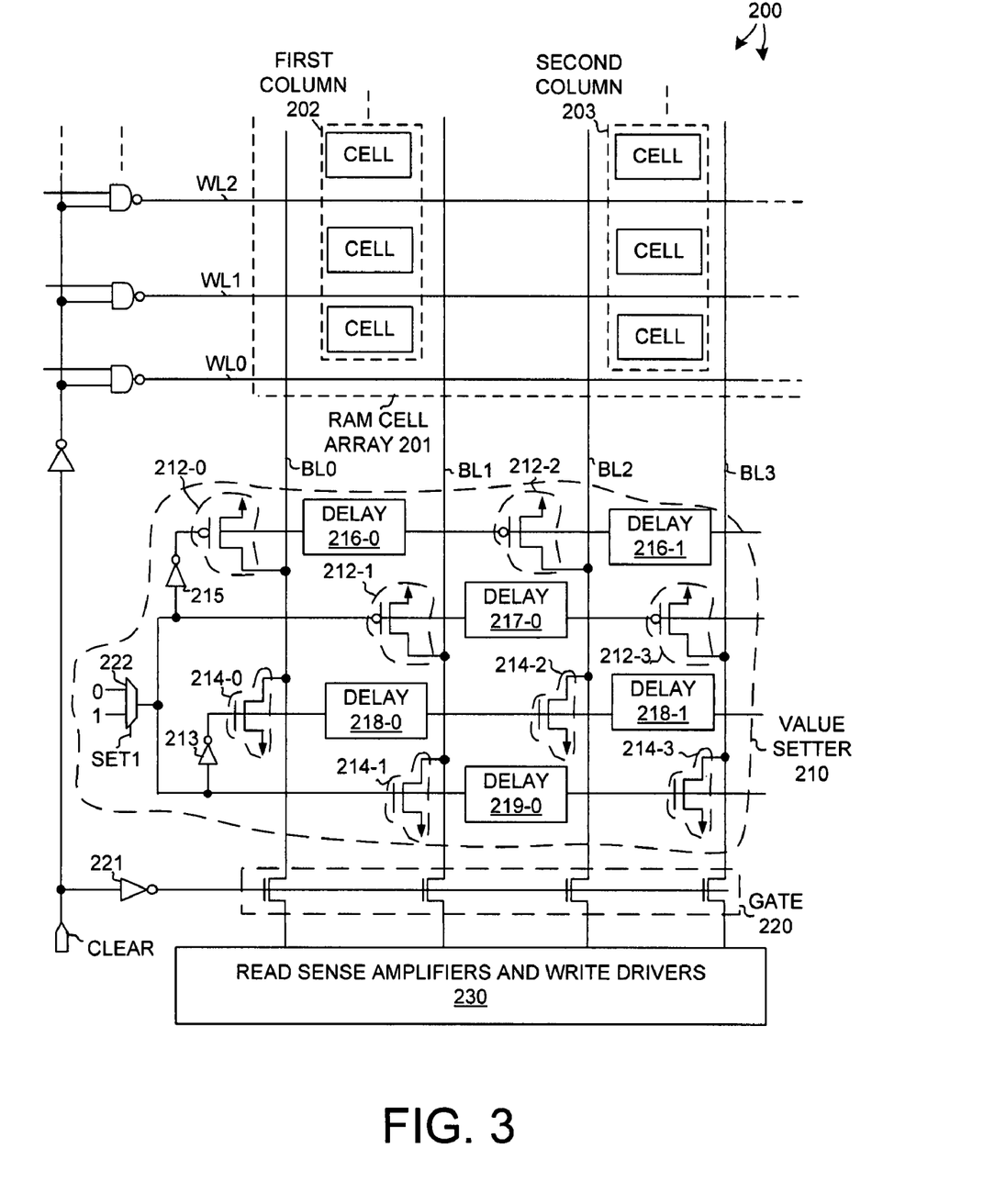
FIG. 3 depicts a random access memory (RAM) array of memory cells that is overwritten in response to a clear signal asserted at terminal CLEAR, in accordance with an embodiment.

FIG. 3 depicts a random access memory (RAM) array 200 of memory cells within SRAM 31 that is overwritten to a value presented at terminal SET1 in response to a clear signal asserted at terminal CLEAR, in accordance with an embodiment. In one aspect, delay elements are included between bit lines in order to transfer control signals that control overwriting of memory cells to a specified value. Memory cells within SRAM 31 store logic zero or logic one values based on voltages asserted at associated bit line pairs. Memory cells are well known and can be implemented using N-channel or P-channel transistors. Detection of an alarm causes tamper and memory control logic 116 to output a logic one value at terminal CLEAR. When a signal at terminal CLEAR is a logic one value, inputs to gate 220 are set to logic zero by inverter 221 to open gate 220 and thereby disconnect bit lines BL0 to BL4 from read sense amplifiers and write drivers 230. When cells in array 200 are overwritten in response to a logic one value at terminal CLEAR, values written to cells are specified by a value at terminal SET1 that is provided to value setter logic 210 as opposed to read sense amplifiers and write drivers 230.

In one aspect, each bit line includes both a pull up PMOS device and a pull down NMOS device. In the example of FIG. 3, value setter 210 includes pull up PMOS device 212-0 and a pull down NMOS device 214-0 for bit line BL0 as well as pull up PMOS devices 212-1 to 212-3 and pull down NMOS devices 214-1 to 214-3 for respective bit lines BL1 to BL3.

For the sake of illustration, four bit lines are shown, but array 200 can include many more bit lines.

When a signal at terminal CLEAR is a logic one value, all word lines WL0 to WL2 are active so that values written to bit line pairs for all active word lines in the array of memory cells overwrite stored values to the value set by value setter 210. Although not shown, decoder circuitry provides word line activation signals to the NAND gate of a word line WL0 to WL2 in the event that a memory cell in the word line is to be read or overwritten using a value other than that at terminal SET1. Value setter 210 issues control signals to bit lines to control writing memory cells to the value at terminal SET1. In this example, bit lines BL0, BL1, BL2, and BL3 are shown, but array 200 can include more than four bit lines. Bit lines BL0 and BL1 are used to program RAM cells in a first column 202 of RAM cells whereas bit lines BL2 and BL3 are used to program a second column 203 of memory cells. Bit line pairs are also referred to as input terminals.

When the signal at terminal SET1 is a logic one, a logic one is to be written to memory cells associated with active word lines in first column 202. Because the signal at terminal SET1 is a logic one, the output from multiplexer 222 is a logic one. A logic one value is presented at inverters 213 and 215 so that a voltage for logic zero is present at the gate of pull down NMOS device 214-0 to turn off pull down NMOS device 214-0 and a voltage for logic zero is present at the gate of pull up PMOS device 212-0 to turn on pull up PMOS device 212-0 so that pull up PMOS device 212-0 connects bias voltage VDD to bit line BL0. In addition, the value of logic one from multiplexer 222 is transferred to pull up PMOS device 212-1 and pull down NMOS device 214-1 of bit line BL1. A logic one value at the gate of pull up PMOS device 212-1 causes pull up PMOS device 212-1 to turn off whereas a logic one value at the gate of pull down NMOS device 214-1 causes pull down NMOS device 214-1 to connect bit line BL1 to a ground potential. Accordingly, bit line BL0 is set to VDD and bit line BL1 is set to ground thereby causing a logic one to be written to the memory cells for which word lines are active for first column 202.

When the signal at terminal SET1 is a logic zero, a logic zero is to be written to memory cells associated with active word lines in first column 202. Because the signal at terminal SET1 is a logic zero, the output from multiplexer 222 is a logic zero. A logic zero value is presented at inverters 213 and 215 so that a voltage equivalent to a logic one is present at the gate of pull down NMOS device 214-0 to turn on pull down NMOS device 214-0 and a voltage equivalent to a logic one is present at the gate of pull up PMOS device 212-0 to turn off pull up PMOS device 212-0 so that pull down NMOS device 214-0 connects bit line BL0 to ground. In addition, the value of logic zero from multiplexer 222 is transferred to pull up PMOS device 212-1 and pull down NMOS device 214-1 of bit line BL1. A logic zero value at the gate of pull up PMOS device 212-1 causes pull up PMOS device 212-1 to turn on and connect bit line BL1 to bias voltage VDD whereas a logic zero value at the gate of pull down NMOS device 214-1 causes pull down NMOS device 214-1 to turn off. Accordingly, bit line BL0 is set to ground and bit line BL1 is set to VDD thereby causing a logic zero to be written to the memory cells for which word lines are active for first column 202.

In accordance with an aspect, at least two delay elements are positioned between bit lines of an array of memory cells and the delay elements propagate a control signal used to control the value written to a column of memory cells so that the same value is written to another column of memory cells after a delay. The columns separated by the delay elements can be adjacent to one another but can be non-adjacent. For example, the same value can be written to another column that is separated from the first column by one or more columns of cells. For example, delay elements 216-0 and 218-0 transfer the control signal presented to pull up device 212-0 and pull down device 214-0 of bit line BL0 to respective pull up device 212-2 and pull down device 214-2 of bit line BL2. Delay elements 217-0 and 219-0 transfer the control signal presented to pull up device 212-1 and pull down device 214-1 of bit line BL1 to respective pull up device 212-3 and pull down device 214-3 of bit line BL3. Delay elements 216-1 and 218-1 transfer control signals from pull up device 212-2 and pull down device 214-2 of bit line BL2 to respective pull up device and pull down device of bit line BL4 (not shown).

After the gate terminal of pull up PMOS device 212-0 for bit line BL0 is programmed by a voltage representing a logic value set by an output from multiplexer 222, the logic value is propagated from a gate terminal of pull up PMOS device 212-0 for bit line BL0 through delay element 216-0 to a gate terminal of pull up PMOS device 212-2 of bit line BL2. Similarly, after the gate terminal of NMOS device 214-0 for bit line BL0 is programmed by a voltage representing a logic value set by an output from multiplexer 222, the logic value is propagated from a gate terminal of pull down NMOS device 214-0 for bit line BL0 through delay element 218-0 to a gate terminal of pull down NMOS device 214-2 of bit line BL2. Similarly, after the gate terminal of pull down NMOS device 214-1 for bit line BL1 is programmed to a voltage representing a logic value, the logic value is propagated from a gate terminal of pull down NMOS device 214-1 for bit line BL1 through delay element 219-0 to a gate terminal of pull down NMOS device 214-3 of bit line BL3. Similarly, after the gate terminal of pull up PMOS device 212-1 for bit line BL1 is programmed to a voltage representing a logic value, the logic value is propagated from a gate terminal of pull up PMOS device 212-1 for bit line BL1 through delay element 217-0 to a gate terminal of pull up PMOS device 212-3 of bit line BL3.

In one embodiment, each delay element is implemented as four inverters in series, but any even number of serially connected inverters can be used. The number of inverters in series depends on the amount of delay desired. In one aspect, the delay is set so that only one column of cells is overwritten with a value at a time and overwriting of a column completes before the value is transferred to bit lines for another terminal. As an example, overwriting 1000 cells in each of 32 columns one column at a time takes approximately 100 nanoseconds. In some cases, sensitive information stored in memory cannot be retrieved by an intruder even in a microsecond and accordingly, the cells can be overwritten much before retrieval of sensitive information.

Each cell has a latch and the bias voltage terminal VDD that connects to the latch is a source of current to change the state of the latch during an overwrite operation. The amount of instantaneous current drawn from the bias voltage terminal VDD depends on the number of columns attempted to be overwritten at the same time. Overwriting one column at-a-time limits the current drawn during overwriting the column. If a second column is attempted to be overwritten while attempting to overwrite the first column, more current is used and the peak amount of current used increases. It is desirable to reduce the amount instantaneous current used because too high an instantaneous current can damage the memory array and neighboring circuitry. In addition, too high an instantaneous current causes the instantaneous voltage provided by the battery to droop and other components that use the voltage from the battery as a supply voltage can malfunction.

Minimizing power consumption in POS terminals is important because the POS terminal may use a non-regenerated power supply in the form of a battery in order to power the operations of the POS terminal. For example, the battery may power overwrite operations described herein. Accordingly, fewer number of columns may be chosen to be overwritten when a lower amount of power is available during the overwrite operations.

Overwriting all cells in a memory array with either a logic one or logic zero can provide an advantage over erasing the cells. After an erase operation, memory cells may store residual charge which can be used to determine the value stored prior to the attempted erase. Overwriting the values prevents detection of values stored prior to overwriting. Writing multiple values in a sequence provides a more reliable overwrite of memory cells than merely writing one value. The first and second pass could be initiated by a single asynchronous clear signal. On a first pass, the cells of a memory array could be first written to logic one and then written to a logic zero on a second pass or vice versa. Other sequences of values can be used.

When a logic low value is asserted to terminal CLEAR, both pull up PMOS devices 212-0 to 212-3 and pull down NMOS devices 214-0 to 214-3 are turned off so that value setter 210 does not write a value to any cell. When cells in array 200 are not to be overwritten in response to a logic one value at terminal CLEAR but are to be overwritten, read sense amplifiers and write drivers 230 specify values to be written. In addition, values stored by cells can be read out from read sense amplifiers and write drivers 230. Although not depicted, circuitry is included so that when the clear signal is a logic zero state, logic ones are asserted to PMOS devices connected to bit lines to turn such PMOS devices off and logic zeros are asserted on NMOS devices for all bit lines to turn such NMOS devices off. Accordingly, the PMOS and NMOS devices do not interfere with the voltages set on the bit lines by read sense amplifiers and write drivers 230.

Figure 4:
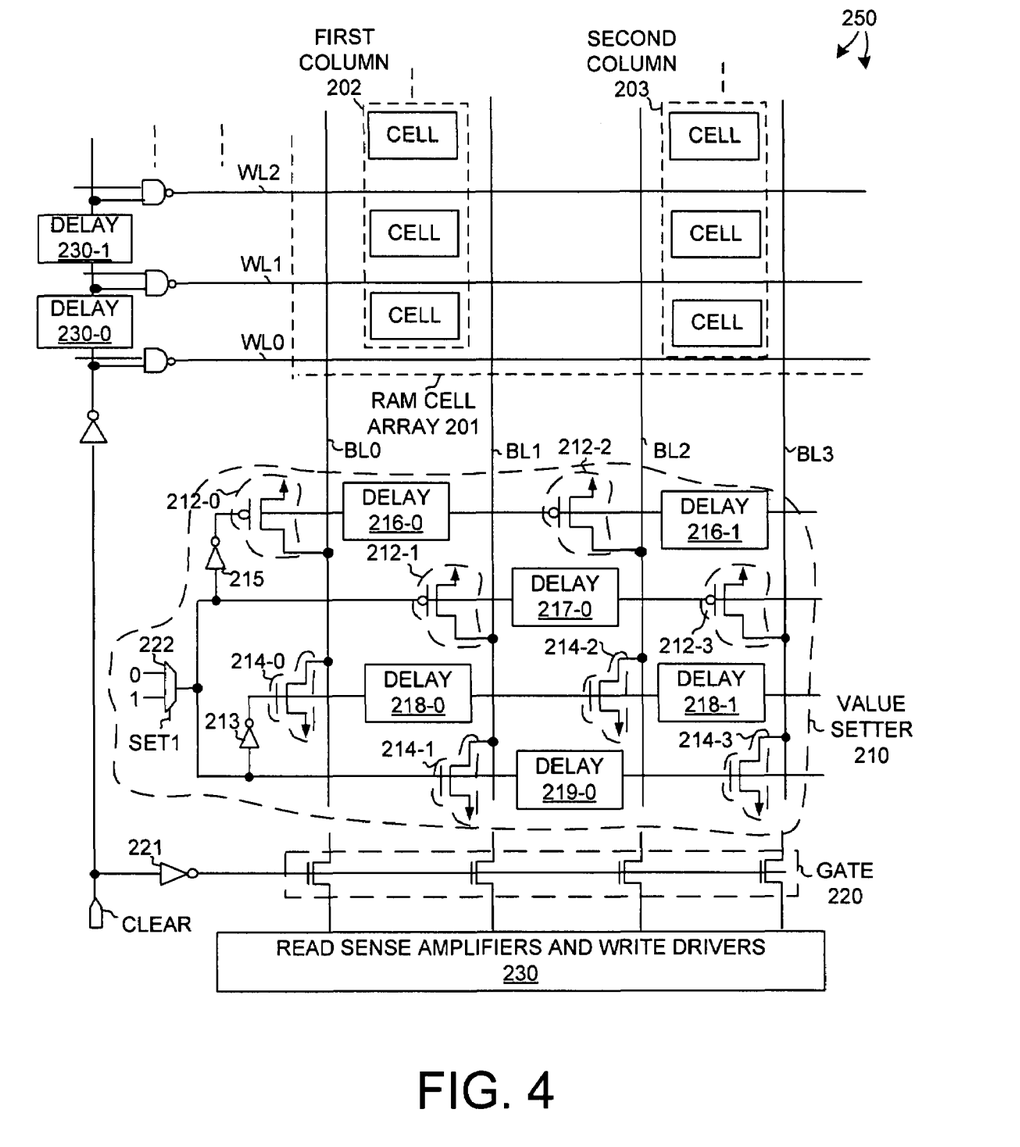
FIG. 4 depicts a memory array with delay elements between word lines and bit lines with a capability to be overwritten in response to a clear signal, in accordance with an embodiment.

FIG. 4 depicts a memory array 250 with delay elements between word lines and bit lines with a capability to be overwritten in response to a clear signal, in accordance with an embodiment. Memory array 250 allows cells to be overwritten one cell at a time as opposed to one column at a time. When a signal at terminal CLEAR is a logic one, word line WL0 is activated and then, after a delay introduced by delay element 230-0, word line WL1 is activated, and so forth. Because the consumption of current depends on a number of cells that are overwritten simultaneously, the amount of current used when individual cells are overwritten one at a time can be even less than that used to overwrite a column of cells at a time. The delay between word lines and delay between bit lines can be set so that cells are overwritten one cell at a time.

Memory arrays 200 and 250 allow cells in previously activated word lines to assist with the overwriting of cells in subsequently activated word lines. Previously activated word lines that remain activated and cells in the activated word lines are connected to bit lines. The more cells connected to bit lines that are in a newly overwritten state, the more capacitance is present on bit lines representative of the newly overwritten state and accordingly, the amount of time and current used to overwrite cells in subsequently activated word lines decreases.

Figure 5:
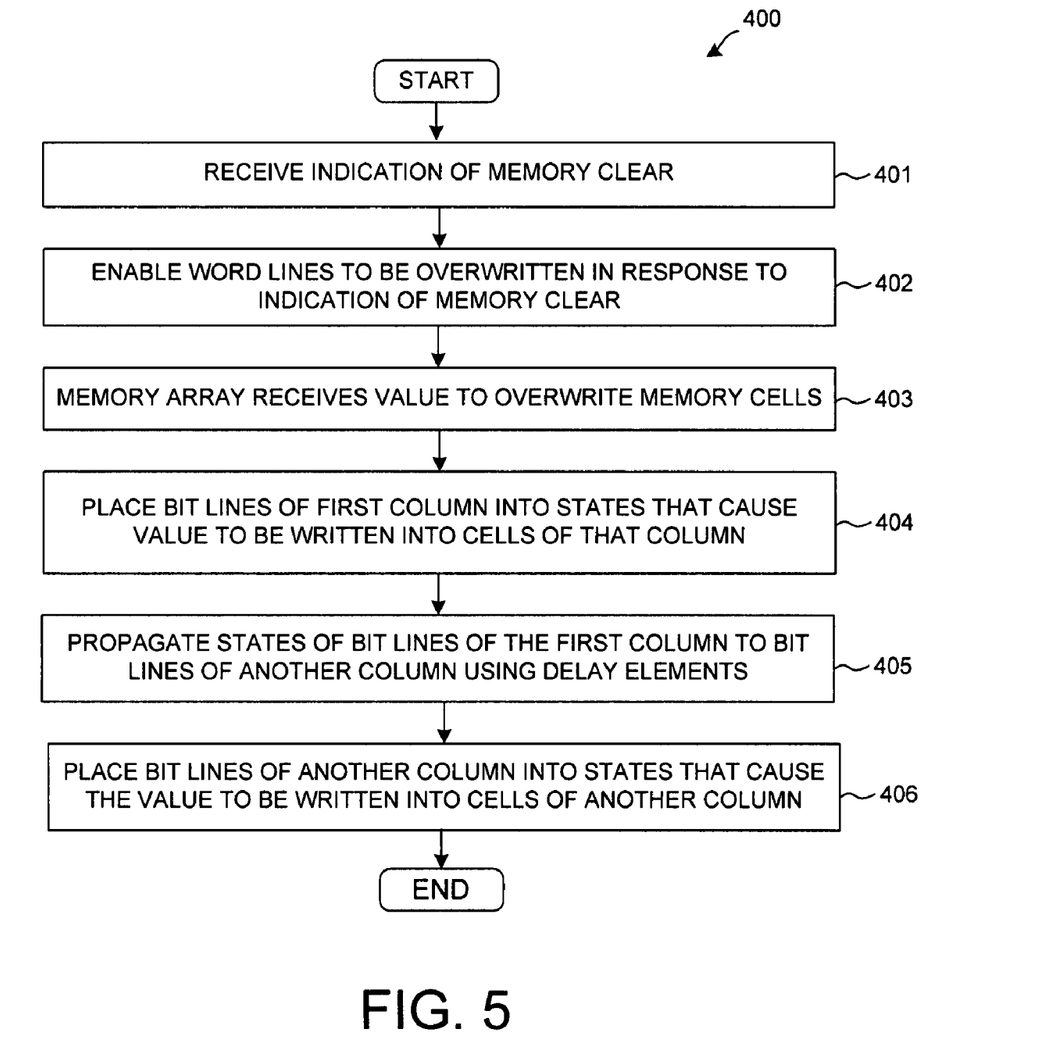
FIG. 5 depicts an example of a process that can be used to overwrite memory arrays in response to a clear signal, in accordance with an embodiment.

FIG. 5 depicts an example of a process that can be used to overwrite memory arrays in response to a clear signal, in accordance with an embodiment. In action 401, a memory array receives a clear signal indicating that the memory array is to be overwritten. One example of the clear signal that indicates the memory array is to be overwritten is the signal received at terminal CLEAR of FIGS. 3 and 4 being in a logic one state. In action 402, all word lines are enabled to be overwritten. With reference to FIG. 3, the signal at terminal CLEAR is propagated to all word lines. However, in action 402, with reference to FIG. 4, each word line after a first word line can be enabled after a delay. In action 403, the memory array receives a value used to overwrite cells of the memory array. The memory cells are overwritten with the value received by the memory array. In action 404, bit line pairs for a first column are set to write the received value onto memory cells in the first column. Referring to FIGS. 3 and 4, the pull up PMOS device or pull down NMOS device connected to each bit line establishes the voltage value for the bit line to cause the received value to be written to cells of the column. The received value controls the voltages established by pull up PMOS device or pull down NMOS device for the bit line. In action 405, delay elements transfer states of bit lines of the first column to bit lines of another column. Referring to FIGS. 3 and 4, delay elements transfer values provided to pull up PMOS device and pull down NMOS device of bit line BL0 to pull up PMOS device and pull down NMOS device of bit line BL2. In addition, delay elements transfer values provided to pull up PMOS device and pull down NMOS device of bit line BL1 to pull up PMOS device and pull down NMOS device of bit line BL3. In action 406, the bit line pairs for another column are placed in states to write the received value onto memory cells of such another column. The another column can be a column adjacent to the first column or separated from the first column by one or more other columns.

Although some embodiments of the present invention have been described in connection with certain specific embodiments for instructional purposes, the present invention is not limited thereto. With regard to the embodiments of FIGS. 3 and 4, delay elements need not be placed between adjacent columns but between every third column or other number so that stripes of columns are overwritten to a particular value. With regard to the embodiments of FIGS. 3 and 4, multiplexer 222 need not be used, but rather, terminal SET1 is coupled to where the output of multiplexer 222 would be coupled. With regard to the embodiment of FIG. 4, random data can be written to the array when the value and clear signal are propagated through the array in a circular manner so that the last row transfers the clear signal to the first row and the last column transfers the value to the first column. Te embodiment of FIG. 4 can be modified so that no delay element is present between any bit line. Te embodiment of FIG. 4 can be modified so that a delay element is not present between every word line. Delay elements can be present between arrays of memory cells so that a clear signal is propagated to another memory array after a delay. The amount of delay introduced between columns or word lines need not be uniform and can increase or decrease further away from the first column or first word line. Accordingly, various modifications, adaptations, and combinations of various features of the described embodiments can be practiced without departing from the scope of the invention as set forth in the claims.

What is claimed is:

1. A method of overwriting memory cells, the method comprising:

receiving a request to overwrite memory cells in an array of memory cells;

receiving a value to write to the memory cells;

writing the value to a first column of the array;

transferring the value after a delay using at least two delay elements; and writing the transferred value to a second column of the array.

2. The method of claim 1, further comprising:
receiving an indication of an alarm event; and
issuing the request in response to receipt of the indication.

3. The method of claim 2, wherein the alarm event is selected from a group consisting of: removal of a covering of a point of sale terminal, change of an impedance of a mesh surrounding an integrated circuit, change in system clock frequency, change in temperature, change in bias voltage level, and powering up or down an integrated circuit.

4. The method of claim 1, further comprising:
enabling overwriting of all rows of the array at substantially the same time.

5. The method of claim 1, further comprising:
enabling overwriting of a first row of the array; and
enabling overwriting of a second row of the array after a delay.

6. The method of claim 1, further comprising:
receiving a second value to write to the memory cells;
writing the second value to the first column of the array;
transferring the second value after a delay; and
writing the transferred second value to the second column of the array, wherein the value is a logic one and the second value is a logic zero.

7. A point of sale (POS) terminal comprising:
a memory device that comprises columns of memory cells that store information; and
tamper and memory control logic that detects a potential tampering with the POS terminal and issues a clear request signal to the memory device, wherein the memory device includes a value setter to set a value to overwrite memory cells in response to receipt of the clear request signal and receipt of the value by the value setter, wherein the value setter issues the value to write to a first column of memory cells and after a delay, transfers the same value to write to a second column of memory cells.

8. The POS terminal of claim 7, wherein the memory device comprises first and second bit lines associated with the first column of memory cells and wherein the value setter comprises:
a first pull up PMOS device having a first terminal coupled to a bias voltage source and having a second terminal coupled to the first bit line;
a first pull down NMOS device having a first terminal coupled to ground potential and having a second terminal coupled to the first bit line;
a second pull up PMOS device having a first terminal coupled to the bias voltage source and having a second terminal coupled to the second bit line; and
a second pull down NMOS device having a first terminal coupled to ground potential and having a second terminal coupled to the second bit line, wherein the value controls which of the first PMOS device, first NMOS device, second PMOS device, and second PMOS device are activated.

9. The POS terminal of claim 7, wherein the tamper and memory control logic issues the clear request signal in response to a condition selected from a group consisting of: removal of a covering of a point of sale terminal, change of an impedance of a mesh surrounding an integrated circuit, change in system clock frequency, change in temperature, change in bias voltage level, and powering up or down an integrated circuit.

10. The POS terminal of claim 7, wherein the memory device overwrites information selected from a group consisting of: financial information, personal identification information, and encryption keys.

11. A memory device comprising:
first and second columns of memory cells;
a first word line that selects a first row of memory cells;
a second word line that selects a second row of memory cells;
a first input terminal associated with the first column of memory cells;
a second input terminal associated with the second column of memory cells; and
a value setter coupled to the first and second input terminals, wherein initiating overwriting the memory cells of the memory device occurs in response to receipt of a clear signal and receipt of a logic value, wherein a control signal applied to the first input terminal controls a logic value written by the value setter to the first column of memory cells, wherein a second control signal applied to the second input terminal controls a logic value written by the value setter to the second column of memory cells, wherein at least two delay elements transfer the control signal from the first input terminal to the second input terminal as the second control signal.

12. The memory device of claim 11, wherein the first input terminal comprises first and second bit lines and wherein the value setter comprises:
a first PMOS pull up device having a first terminal coupled to a bias voltage source and having a second terminal coupled to the first bit line;
a first NMOS pull down device having a first terminal coupled to ground potential and having a second terminal coupled to the first bit line;
a second PMOS pull up device having a first terminal coupled to the bias voltage source and having a second terminal coupled to the second bit line; and
a second NMOS pull down device having a first terminal coupled to ground potential and having a second terminal coupled to the second bit line, wherein the control signal is provided to gate terminals of the first PMOS device, first NMOS device, second PMOS device, and second PMOS device and wherein the control signal controls which of the first PMOS device, first NMOS device, second PMOS device, and second PMOS device are activated.

13. The memory device of claim 12, wherein the second input terminal comprises third and fourth bit lines and wherein the value setter further comprises:
a third pull up PMOS device having a first terminal coupled to the bias voltage source and having a second terminal coupled to the third bit line;
a third pull down NMOS device having a first terminal coupled to ground potential and having a second terminal coupled to the third bit line;
a fourth pull up PMOS device having a first terminal coupled to the bias voltage source and having a second terminal coupled to the fourth bit line; and
a fourth pull down NMOS device having a first terminal coupled to ground potential and having a second terminal coupled to the fourth bit line, wherein
the at least two delay elements comprises first, second, third, and fourth delay elements,
the first delay element transfers the control signal provided to the first pull up PMOS device to the third pull up PMOS device as the second control signal,
the second delay element transfers the control signal provided to the first pull down NMOS device to the third pull down NMOS device as the second control signal, the third delay element transfers the control signal provided to the second pull up PMOS device to the fourth pull up PMOS device as the second control signal, the fourth delay element transfers the control signal provided to the second pull down NMOS device to the fourth pull down NMOS device as the second control signal, and the second control signal controls which of the third PMOS device, third NMOS device, fourth PMOS device, and fourth NMOS device are activated.

14. The memory device of claim 11, further comprising:
an input terminal that receives an indication of when memory cells are requested to be cleared.

15. The memory device of claim 11, further comprising:
read sense amplifiers that read values provided from memory cells;
write drivers that provide input signals to the bit lines to write values to the memory cells; and
gate logic that controls whether the read sense amplifiers and write drivers are electrically coupled to the input terminals based on a state of the clear signal.

16. The memory device of claim 11, wherein the memory cells store information selected from a group consisting of: financial information, identification information, and encryption keys.

17. The memory device of claim 11, wherein each of the at least two delay element comprises an even number of serially connected inverters.

18. The memory device of claim 11, wherein all word lines are activated at substantially the same time in response to the clear signal.

19. The memory device of claim 11, further comprising:
a delay element that couples the first word line to the second word line, wherein the second word line is activated to be overwritten following a delay from when the first word line is activated.

20. The memory device of claim 11, wherein the first and second columns of memory cells are not adjacent.

21. An apparatus comprising:
a clear signal terminal; and
means for overwriting stored information in response to a clear signal at the clear signal terminal and receipt of a logic value, the means comprising:
a first column of memory cells,
a second column of memory cells,
a first input terminal associated with the first column of memory cells,
a second input terminal associated with the second column of memory cells,
a word line associated with each row of memory cells, and
at least two delay elements positioned between the first and second input terminals, wherein the at least two delay elements transfer control signals used to set values stored in memory cells from the first input terminal to the second input terminal after a delay.

22. The apparatus of claim 21, wherein:
the first input terminal comprises first and second bit lines,
the second input terminal comprises third and fourth bit lines,
a control signal applied to the first and second bit lines causes the logic value to be stored to the first column of memory cells,
a second control signal applied to the third and fourth bit lines causes the logic value to be stored to the second column of memory cells,
the at least two delay elements comprise first and second delay elements,
the control signal is provided from the first bit line to the third bit line as the second control signal through the first delay element, and
the control signal is provided from the second bit line to the fourth bit line as the second control signal through the second delay element.

23. The apparatus of claim 21, wherein all word lines are selected to be overwritten at substantially the same time in response to the clear signal at the clear signal terminal.

24. The apparatus of claim 21, further comprising:
a conductive coupling that transfers the clear signal to a first word line; and
a delay element present between two word lines, wherein the delay element transfers the clear signal from the first word line to a second word line after a delay.

* * * * *